US007251571B2

(12) United States Patent
Zhu et al.

(10) Patent No.: US 7,251,571 B2
(45) Date of Patent: Jul. 31, 2007

(54) METHODS OF DIAGNOSING OPEN-SECONDARY WINDING OF AN IGNITION COIL USING THE IONIZATION CURRENT SIGNAL

(75) Inventors: Guoming G. Zhu, Novi, MI (US); Kevin D. Moran, Trenton, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 264 days.

(21) Appl. No.: 10/655,985

(22) Filed: Sep. 5, 2003

(65) Prior Publication Data

US 2005/0055169 A1 Mar. 10, 2005

(51) Int. Cl.
*G01R 19/00* (2006.01)
*G01R 27/00* (2006.01)

(52) U.S. Cl. .................... 702/64

(58) Field of Classification Search .................. 702/57, 702/64, 65, 108, 117, 118; 73/35.06, 35.07, 73/35.08; 123/594, 620; 324/380, 388, 324/399

See application file for complete search history.

(56) References Cited

U.S. PATENT DOCUMENTS

| | | | | |
|---|---|---|---|---|
| 4,648,367 A | | 3/1987 | Gillbrand et al. | 123/406.26 |
| 4,903,676 A | | 2/1990 | Gillbrand et al. | 123/639 |
| 5,054,461 A | * | 10/1991 | Deutsch et al. | 123/609 |
| 5,207,200 A | | 5/1993 | Iwata | 123/406.14 |
| 5,392,641 A | | 2/1995 | McCombie | 73/117.3 |
| 5,397,964 A | | 3/1995 | Edwards | 315/209 T |
| 5,483,818 A | | 1/1996 | Brandt et al. | 73/35.01 |
| 5,495,757 A | | 3/1996 | Atanasyan et al. | 73/35.06 |
| 5,510,715 A | | 4/1996 | Takeuchi | 324/391 |
| 5,534,781 A | | 7/1996 | Lee et al. | 324/380 |
| 5,563,515 A | | 10/1996 | Kako | 324/391 |

(Continued)

FOREIGN PATENT DOCUMENTS

EP 0526219 A3 2/1993

(Continued)

OTHER PUBLICATIONS

Pending U.S. Appl. No. 10/458,716, filed Jun. 2003, entitled "A Method of Detecting Cylinder ID Using In-Cylinder Ionization for Spark Detection Following Partial Coil-Charging" by Daniels et al. ( 63 pages w/ 54 pages of drawings).

(Continued)

*Primary Examiner*—Michael Nghiem
(74) *Attorney, Agent, or Firm*—Dickinson Wright PLLC

(57) ABSTRACT

In a first embodiment, the present invention is a method of detecting an open secondary winding, including the steps of enabling an integrator, resetting the integrator, detecting an ionization current, integrating the ionization current over a spark window, comparing the integrated ionization current with a threshold, and setting an open secondary flag if the integrated ionization current is below the threshold. In another preferred embodiment, the invention is a method of detecting an open secondary winding by measuring spark duration including the steps of comparing an ionization signal with a first threshold, measuring the spark duration when the ionization signal is greater than the first threshold, comparing said spark duration with a second threshold, and setting an open secondary flag.

6 Claims, 9 Drawing Sheets

U.S. PATENT DOCUMENTS

| | | | | |
|---|---|---|---|---|
| 5,602,332 | A | 2/1997 | Pyko | 73/117.3 |
| 5,623,209 | A | 4/1997 | Lepley et al. | 324/382 |
| 5,672,972 | A | 9/1997 | McCoy et al. | 324/393 |
| 5,753,804 | A | 5/1998 | La Palm et al. | 73/116 |
| 5,778,855 | A | 7/1998 | Czekala et al. | 123/406.27 |
| 5,824,890 | A | 10/1998 | La Palm et al. | 73/117.3 |
| 5,861,551 | A | 1/1999 | Morita et al. | 73/116 |
| 6,029,631 | A | 2/2000 | Jiewertz et al. | 123/491 |
| 6,054,859 | A | 4/2000 | Takahashi et al. | 324/399 |
| 6,092,015 | A | 7/2000 | Takahashi et al. | 701/101 |
| 6,104,195 | A | 8/2000 | Yoshinaga et al. | 324/459 |
| 6,123,057 | A | 9/2000 | Goras et al. | 123/406.2 |
| 6,186,129 | B1 | 2/2001 | Butler, Jr. | 123/620 |
| 6,196,054 | B1 | 3/2001 | Okamura et al. | 73/35.08 |
| 6,199,540 | B1 | 3/2001 | Katashiba et al. | 123/478 |
| 6,202,474 | B1 | 3/2001 | Takahashi et al. | 73/35.08 |
| 6,205,844 | B1 | 3/2001 | Morita et al. | 73/35.08 |
| 6,211,680 | B1 | 4/2001 | Hohner et al. | 324/398 |
| 6,213,108 | B1 | 4/2001 | Boyer et al. | 123/595 |
| 6,216,092 | B1 | 4/2001 | Kong | 702/50 |
| 6,216,530 | B1 | 4/2001 | Shimizu et al. | 73/116 |
| 6,222,368 | B1 | 4/2001 | Inagaki et al. | 324/399 |
| 6,223,735 | B1 | 5/2001 | Poggio et al. | 123/694 |
| 6,234,146 | B1 | 5/2001 | Tanaya et al. | 123/406.37 |
| 6,246,952 | B1 | 6/2001 | Honda | 701/111 |
| 6,263,727 | B1 | 7/2001 | Butler, Jr. | 73/117.2 |
| 6,275,041 | B1 | 8/2001 | Okamura et al. | 324/380 |
| 6,278,932 | B1 | 8/2001 | Baumel et al. | 701/104 |
| 6,279,538 | B1 | 8/2001 | Herweg et al. | 123/435 |
| 6,281,682 | B1 | 8/2001 | Kameda et al. | 324/391 |
| 6,298,823 | B1 | 10/2001 | Takahashi et al. | 123/406.37 |
| 6,298,837 | B1 | 10/2001 | Ketterer et al. | 123/644 |
| 6,328,016 | B1 | 12/2001 | Takahashi et al. | 123/406.35 |
| 6,334,353 | B1 | 1/2002 | Nobe et al. | 73/35.04 |
| 6,336,355 | B1 | 1/2002 | Sasaki et al. | 73/35.08 |
| 6,338,267 | B1 | 1/2002 | Karau | 73/35.03 |
| 6,343,499 | B1 | 2/2002 | Inagaki et al. | 73/23.32 |
| 6,343,500 | B1 | 2/2002 | Katogi et al. | 73/35.08 |
| 6,348,797 | B1 | 2/2002 | Shimizu et al. | 324/399 |
| 6,348,799 | B1 | 2/2002 | Herweg et al. | 324/464 |
| 6,357,426 | B1 | 3/2002 | Schleupen | 123/606 |
| 6,360,587 | B1 | 3/2002 | Noel | 73/35.08 |
| 6,453,733 | B1 | 9/2002 | Malaczynski et al. | 73/116 |
| 6,998,846 | B2 * | 2/2006 | Daniels et al. | 324/399 |
| 7,055,372 | B2 * | 6/2006 | Daniels et al. | 73/35.08 |
| 2003/0164026 | A1 | 9/2003 | Koseluk et al. | |
| 2004/0083794 | A1 * | 5/2004 | Daniels et al. | 73/35.08 |
| 2004/0085070 | A1 * | 5/2004 | Daniels et al. | 324/391 |
| 2005/0050948 | A1 * | 3/2005 | Zhu et al. | 73/117.3 |

FOREIGN PATENT DOCUMENTS

| | | | |
|---|---|---|---|
| GB | 2396186 | A | 6/2004 |
| GB | 2 405 668 | * | 3/2005 |

OTHER PUBLICATIONS

Combined Search and Examination Report Under Sections 17 and 18(3), dated Dec. 21, 2004 (3 pages).

French Preliminary Search Report Dated Feb. 14, 2006 (2 pages).

* cited by examiner

METHODS OF DIAGNOSING OPEN-SECONDARY WINDING OF AN IGNITION COIL USING THE IONIZATION CURRENT SIGNAL

BACKGROUND OF THE INVENTION

1. Technical Field

This invention is related to the field of internal combustion (IC) engine ignition systems. More particularly, it is related to the field of detecting an open secondary winding of an ignition coil.

2. Discussion

Typically, an ignition coil and an ignition or a spark plug are disposed in a combustion chamber of an internal combustion engine. The ignition coil includes a primary winding and a secondary winding. The ignition plug is connected in electrical series between a first end of the secondary winding and ground potential. If the spark plug is not connected (as is the case where the secondary is open), no spark will be generated, and part of the charged energy is dissipated through ringing current caused by capacitance between the secondary winding and ground. Since the charged energy is not dissipated by a spark, the fly-back energy dissipated by the IGBT over the primary winding side after the end of charge is much higher than the case when the secondary winding is connected to a spark plug and a spark occurred after the coil was charged. In fact, the total energy dissipated by the IGBT connected to the ignition coil with an open secondary winding could be as great as four times more than when the secondary winding is connected to a spark plug. This indicates that the heat dissipation of the IGBT could be four times more than the normal operational condition. A heat sink is required to protect the IGBT from being overheated for both normal operational and open secondary conditions. This increases cost of the ignition system. However, in some cases the open-secondary condition may be prevented.

SUMMARY OF THE INVENTION

The failure of a spark plug to spark is reflected in the ionization signal. Since there is no ignition current in the case of an open-secondary winding, an open secondary winding can be detected by observing whether a spark occurred.

The present invention comprises a method of detecting an open secondary winding, comprising the steps of enabling an integrator, resetting the integrator, detecting an ionization signal, integrating the ionization signal over a spark window, comparing the integrated ionization signal with a threshold, and setting an open secondary flag if the integrated ionization signal is below a threshold.

In another preferred embodiment, the step of enabling an integrator comprises sending an open secondary detection enable flag signal to an enable input of the integrator.

In a further preferred embodiment, the present invention is a method of detecting an open secondary winding, comprising the step of measuring spark duration.

In another preferred embodiment, the step of measuring spark duration comprises the steps of comparing an ionization signal with a first threshold, measuring the spark duration when the ionization signal is greater than the first threshold, comparing the spark duration with a second threshold, and setting an open secondary flag.

In a further preferred embodiment, the step of measuring spark duration comprises the steps of detecting an ionization signal over a spark window, comparing the ionization signal with a first threshold, enabling a timer if the detected ionization signal is greater than the first threshold, disabling the timer after the detected ionization signal falls below the first threshold, comparing the timer's output with a second threshold, and setting an open secondary flag if the timer's output is below the second threshold.

In another preferred embodiment, the present invention is an open secondary winding detection apparatus, comprising a first comparator having a first and a second input and an output, wherein the first input is operably connected to an ionization signal and the second input is operably connected to a first threshold, a controller having a first and an enable input, and an output, wherein the first input is operably connected to the output of the first comparator, a timer having a first and an enable input, and an output, wherein the first input is operably connected to the output of the controller, and a second comparator having a first and a second input and an output, wherein the first input is operably connected to the output of the timer and the second input is operably connected to a second threshold.

In a further preferred embodiment, the open secondary winding detection apparatus comprises an integrator having an ionization signal input, an enable input, a reset input and an output, and a comparator having a first input operably connected to the output of the integrator, a second input operably connected to a threshold value, and an output.

In another preferred embodiment, the open secondary winding detection apparatus further comprises a powertrain control module having an input operably connected to the output of the comparator and an output operably connected to the enable input of the integrator, whereby an open secondary detection enable flag signal is sent by the powertrain control module to the enable input of the integrator, and wherein the reset input of the integrator is operably connected to an ignition charge pulse and the ionization signal input of the integrator is operably connected to an ionization current measuring circuit.

Further scope of applicability of the present invention will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The present invention will become more fully understood from the detailed description given here below, the appended claims, and the accompanying drawings in which:

DETAILED DESCRIPTION OF THE PREFERRED EMBODIMENT

In a preferred embodiment, the invention comprises two methods of detecting an open-secondary winding 18 using the ionization current 100. The first method measures spark energy and the second measures spark duration.

Figure 1:
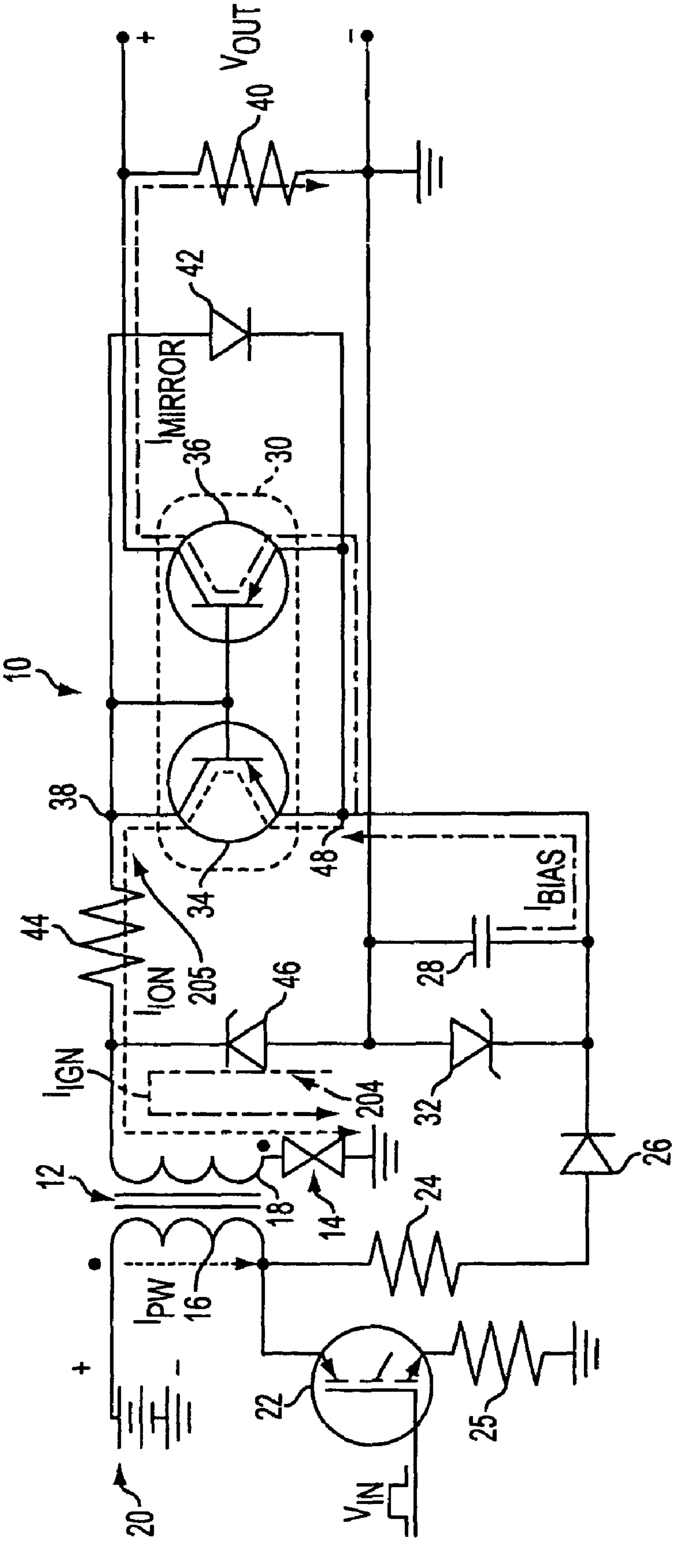
FIG. 1 is an electrical schematic of a circuit for measuring ionization current in a combustion chamber of an internal combustion engine.

FIG. 1 is a basic electrical schematic of a circuit 10 that can be used for measuring ionization current in a combustion chamber of an internal combustion engine. The ionization current measuring circuit 10 includes an ignition coil 12 and an ignition or a spark plug 14 disposed in a combustion chamber of an internal combustion engine. The ignition coil 12 includes a primary winding 16 and a secondary winding 18. The ignition plug 14 is connected in electrical series between a first end of the secondary winding 18 and ground potential. The electrical connections to a second end of the secondary winding 18 are described further below. A first end of the primary winding 16 is electrically connected to a positive electrode of a battery 20. A second end of the primary winding 16 is electrically connected to the collector terminal of an insulated gate bipolar transistor (IGBT) or other type of transistor or switch 22 and a first end of a first resistor 24. The base terminal of the IGBT 22 receives a control signal, labeled $V_{IN}$ in FIG. 1, from a powertrain control module (PCM) 95. Control signal $V_{IN}$ gates IGBT 22 on and off, thus charging the primary winding of the ignition coil. When the charge is completed (or in other words, when the IGBT is turned off), the voltage builds up over the secondary winding. If there is a spark plug connected to the secondary winding and the voltage is high enough to jump the spark gap, a spark will be generated between the spark gap. The charged energy produced is then dissipated through the spark current.

A second resistor 25 is electrically connected in series between the emitter terminal of the IGBT 22 and ground. A second end of the first resistor 24 is electrically connected to the anode of a first diode 26. The circuit 10 further includes a capacitor 28. A first end of the capacitor 28 is electrically connected to the cathode of the first diode 26 and a current mirror circuit 30. A second end of the capacitor 28 is grounded. A first zener diode 32 is electrically connected across or, in other words, in parallel with the capacitor 28 with the cathode of the first zener diode 32 electrically connected to the first end of the capacitor 28 and the anode of the first zener diode 32 electrically connected to ground.

The current mirror circuit 30 includes first and second pnp transistors 34 and 36 respectively. The pnp transistors 34 and 36 are matched transistors. The emitter terminals of the pnp transistors 34 and 36 are electrically connected to the first end of the capacitor 28. The base terminals of the pnp transistors 34 and 36 are electrically connected to each other as well as a first node 38. The collector terminal of the first pnp transistor 34 is also electrically connected to the first node 38, whereby the collector terminal and the base terminal of the first pnp transistor 34 are shorted. Thus, the first pnp transistor 34 functions as a diode. A third resistor 40 is electrically connected in series between the collector terminal of the second pnp transistor 36 and ground.

A second diode 42 is also included in the circuit 10. The cathode of the second diode 42 is electrically connected to the first end of the capacitor 28 and the emitter terminals of the first and second pnp transistors 34 and 36. The anode of the second diode 42 is electrically connected to the first node 38.

The circuit 10 also includes a fourth resistor 44. A first end of the fourth resistor 44 is electrically connected to the first node 38. A second end of the fourth resistor 44 is electrically connected the second end of the secondary winding 18 (opposite the ignition plug 14) and the cathode of a second zener diode 46. The anode of the second zener diode 46 is grounded.

In a spark ignition (SI) engine system, the spark plug 14 already inside of the combustion chamber can be used as a detection device without requiring the intrusion of a separate sensor. During the engine combustion process, a large amount of ions are produced in the plasma. For example, H3O+, C3H3+, and CHO+ are produced by the chemical reactions at the flame front and have a sufficiently long enough exciting time to be detected. If a voltage is applied across the spark plug gap, these free ions are attracted. As a result of this attraction, an ionization signal 100 is generated.

Figure 2:
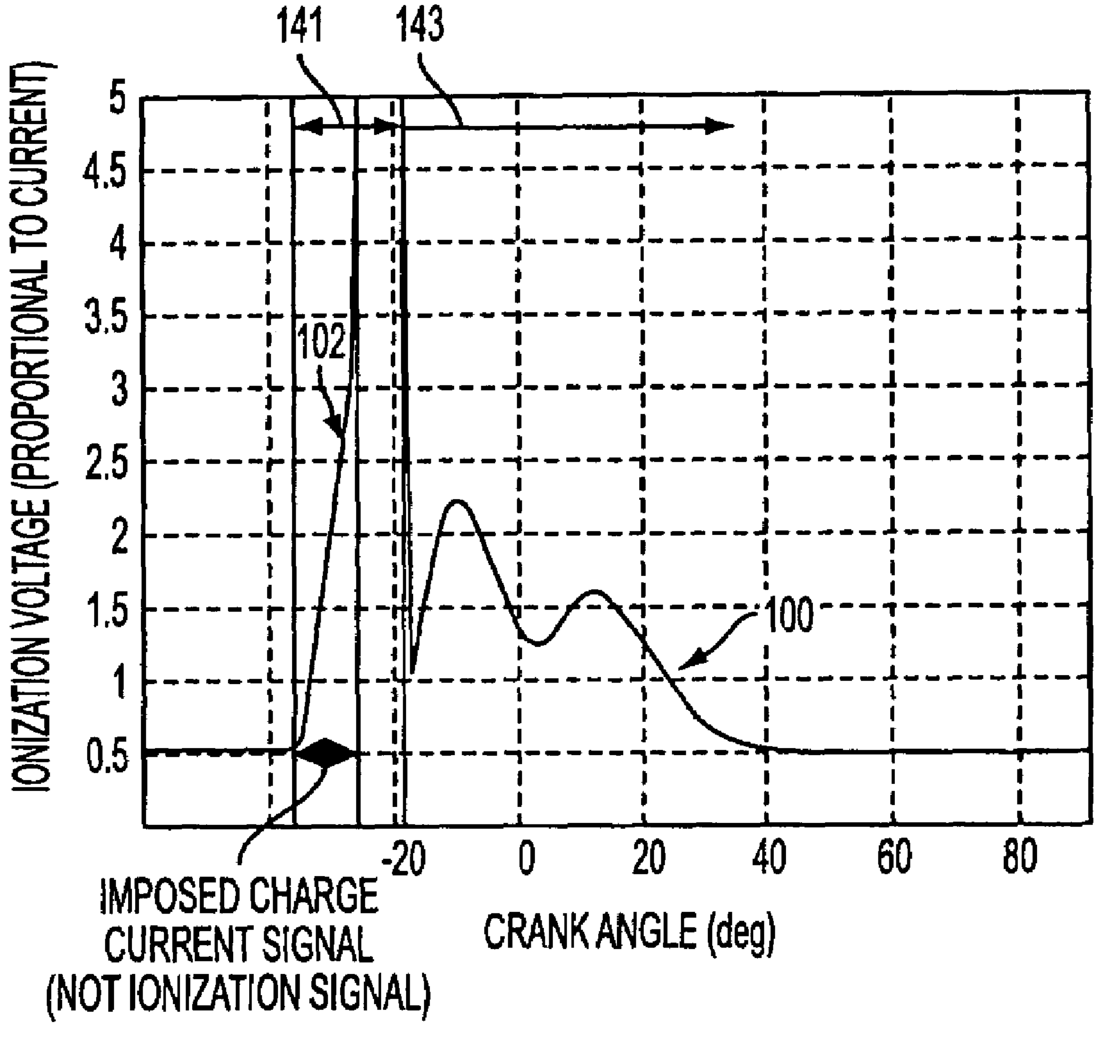
FIG. 2 is a graph of an ionization signal.

The spark plug ionization signal 100 measures the local conductivity at the spark plug gap when combustion occurs in the cylinder. The changes of the ionization signal 100 versus crank angle can be related to different stages of a combustion process. The ionization signal 100 typically has two phases: the ignition phase, and the post ignition phase. The ignition phase occurs when the ignition coil 12 is charged and later ignites the air/fuel mixture. The post ignition phase occurs when the flame develops in the cylinder (flame front movement during the flame kernel formation). The present invention uses the ignition phase ionization signal, which provides a saturated ignition current measurement that can be used to detect an open secondary. The ionization current in the post ignition phase has been shown to be strongly related to the minimum timing for the best torque (MBT) ignition timing, the air/fuel ratio, the exhaust gas recirculation (EGR) rate, the peak cylinder pressure location, the burn rate, etc. FIG. 2 shows a plot of an ionization signal or ionization voltage (proportional to ionization current $I_{ION}$ 205) with both charge ignition 141 and post-charge ignition signals 143.

Figure 3:
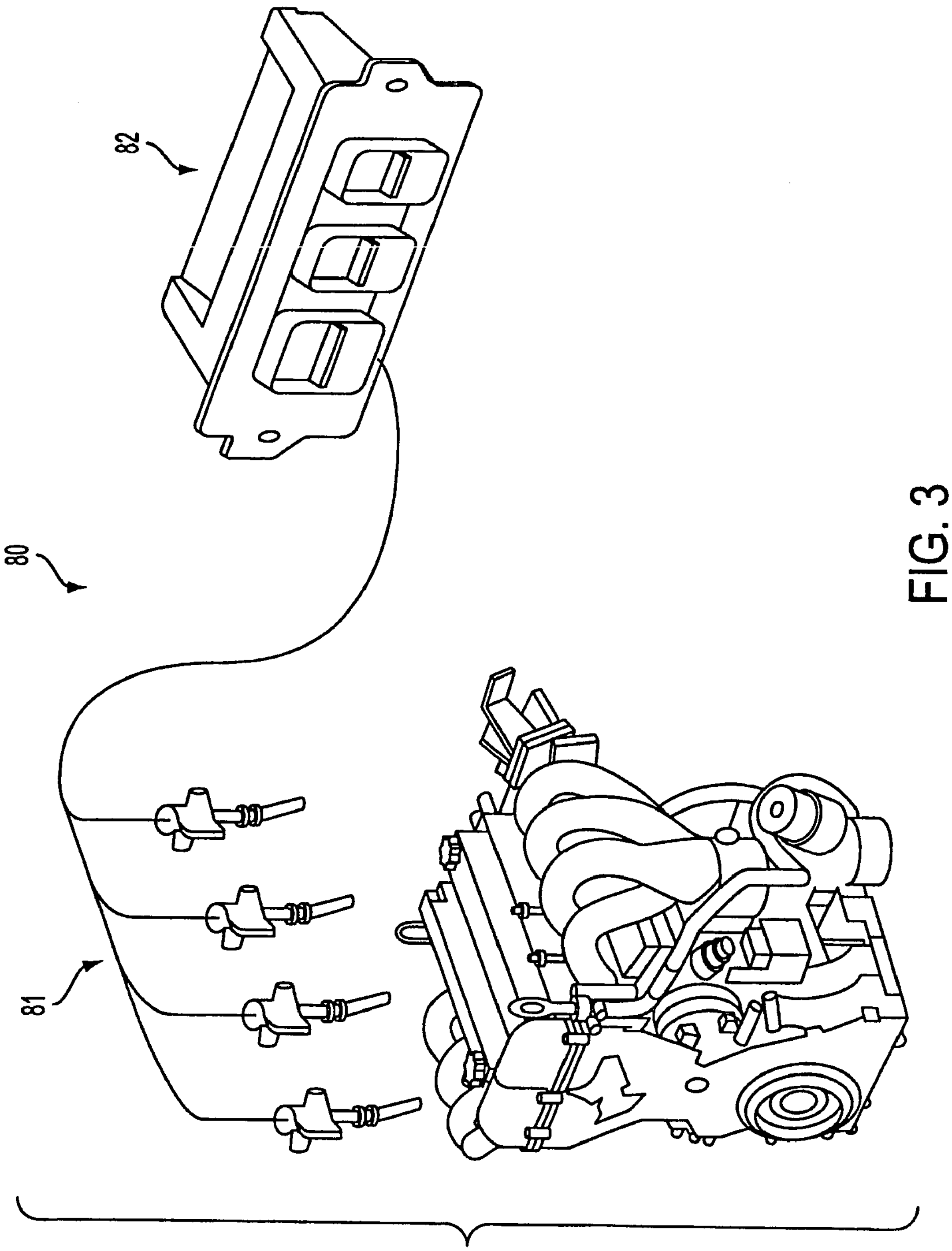
FIG. 3 illustrates a production ionization current detection setup.

A typical ignition system with ionization detection capability is shown in FIG. 3. The ionization detection setup 80 consists of a coil-on-plug or pencil coil arrangement, with a device in each coil to apply a bias voltage across the tip when the spark isn't arcing. The current across the spark plug tip is isolated by a current mirror and amplified prior to being measured. The coils 81 (with ion detection) are attached to a module 82 (with ion processing).

The failure of a spark plug 14 to spark is reflected in the ionization signal 100 during its ignition phase 141. As stated earlier, the present invention discloses two open secondary detection methods, an ionization spark energy measurement method and a spark duration measurement method.

An open secondary winding 18 can be detected by observing whether a spark occurred. The energy is defined as the ionization voltage 100 during ignition integrated over an ignition window. Typically, the ionization spark energy, which is different from the actual spark energy, can be approximated by using the formula $$E=\int_0^T V^2_{ION}/R\, dt,$$

where E represents energy, $V_{ION}$ represents ionization voltage proportional to ionization current 205, R represents load resistance, and T represents spark duration. In a preferred embodiment, ionization voltage 100 is integrated over the spark window 85 and the integrated energy 87 obtained is compared with a reference or threshold 89. If the integrated energy 87 is less than the threshold 89, then no spark occurred and the secondary winding 18 is assumed to be open. The spark window 85 is defined as a fixed time duration after charge is completed. In a preferred embodiment, the present ignition system uses a spark window 85 with a width of 500 microseconds. The spark window 85 size can fall anywhere between 300 microseconds and 3 milliseconds, depending on the actual spark duration of the given ignition system. Thus, one advantage of the present invention is that it integrates the ionization voltage 100 or ionization signal 100 over a short spark window, thus reducing processing time.

Since resistance R is assumed to be constant due to the ionization measurement circuit, and it is known that the circuit saturates during a spark event, multiplying $V_{MAX}^2$ (where $V_{MAX}$ is the maximum voltage that an ionization measurement circuit produces) by the spark window time 85 results in a representative integrated energy value 87 or integrated value 87. In order to simplify the integration calculation, instead of integrating the square of the ionization voltage, the ionization voltage 100 is integrated directly. A representative or typical integrated energy value for a cylinder that sparked is (5V)*0.5 msec (assuming the resistor value equal to one), which is approximately proportional to the actual spark energy that is defined by the integration of the product of spark voltage and current over the spark window. The 0.5 msec represents a typical integration window 85 at a typical engine speed (1500 RPM) and load (2.62 bar BMEP—Brake Mean Effective Pressure). The actual window varies with engine speed and load. The 5 volts represents the maximum value that the ionization measurement circuit shown in FIG. 1 produces. The reference value or threshold energy level 89 is set at 75% of this typical integrated energy value 87. The actual threshold level 89 could vary between 65 to 85 percent of the typical integrated energy value 87 or integrated value 87. Thus, the threshold 89 is calculated by using a maximum voltage $V_{MAX}$ that an ionization measurement circuit produces, multiplying this maximum voltage $V_{MAX}$ by a spark window time 85, whereby a typical integrated energy value 87 is calculated, and multiplying the integrated energy value 87 by a percentage.

In a preferred embodiment, detection of an open secondary 18 occurs during the ignition phase 141 of the ionization signal 100. For an ionization detection system with ionization and ignition or spark current 204 flowing in the same direction (see FIG. 1), the mirrored ionization current is proportional to the ignition current 204 during the spark window 85.

Since the ignition current 204 is at a milliampere level and the ionization current 205 is at the microampere level, the ignition current 204 which is proportional to the ignition phase 141 ionization voltage shown in the ionization signal measurement is often saturated, see FIG. 2. The ignition phase 141 ionization voltage shown in FIG. 2 consists of two portions, charge current and ignition current. The ramped portion 102 of the signal is proportional to the primary charge current and represents the imposed charge current signal. The pulse 104 represents the saturated ignition current 204 (see FIG. 4).

Figure 4A:
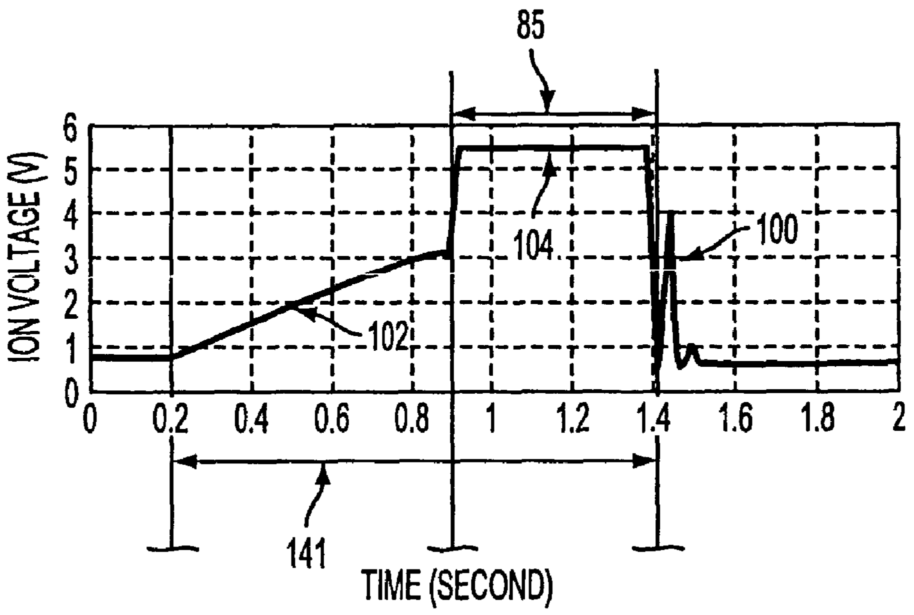
FIG. 4*a* is a plot of an ionization signal for a closed secondary winding.
Figure 4B:
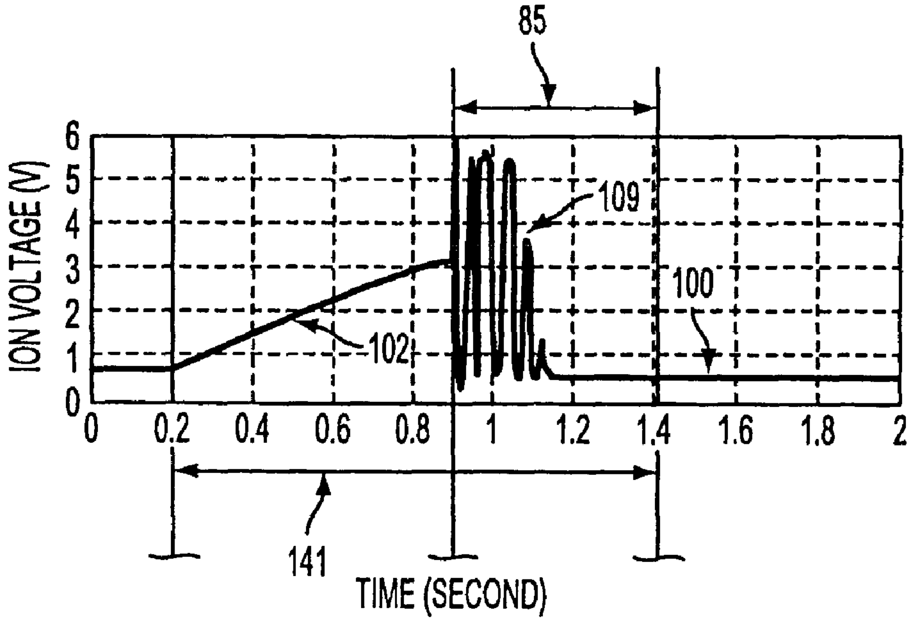
FIG. 4*b* is a plot of an ionization signal for an open secondary winding.

Note that there is no ignition current in the case of an open-secondary winding 18. FIG. 4 shows a comparison of the ignition phase ionization voltage 100 for the normal operation (FIG. 4*a*) and with an open secondary 18 (FIG. 4*b*). An ignition current pulse which is proportional to the ignition voltage pulse 104 shown in FIG. 4*a* can be observed for a normal operational conditions, and only a ringing voltage 109 which is proportional to a ringing current can be observed for the open-secondary case (FIG. 4*b*).

Therefore, the proposed method of detecting the open secondary winding 18 is to integrate the ionization voltage 100 over the spark window 85 or integration window 85 and then compare the integrated value 87 with a given threshold energy level 89. If the integrated value 87 is below the threshold 89, then there is an open secondary 18. Threshold 89 can also be a function of engine operational speed, load, etc.

Figure 5:
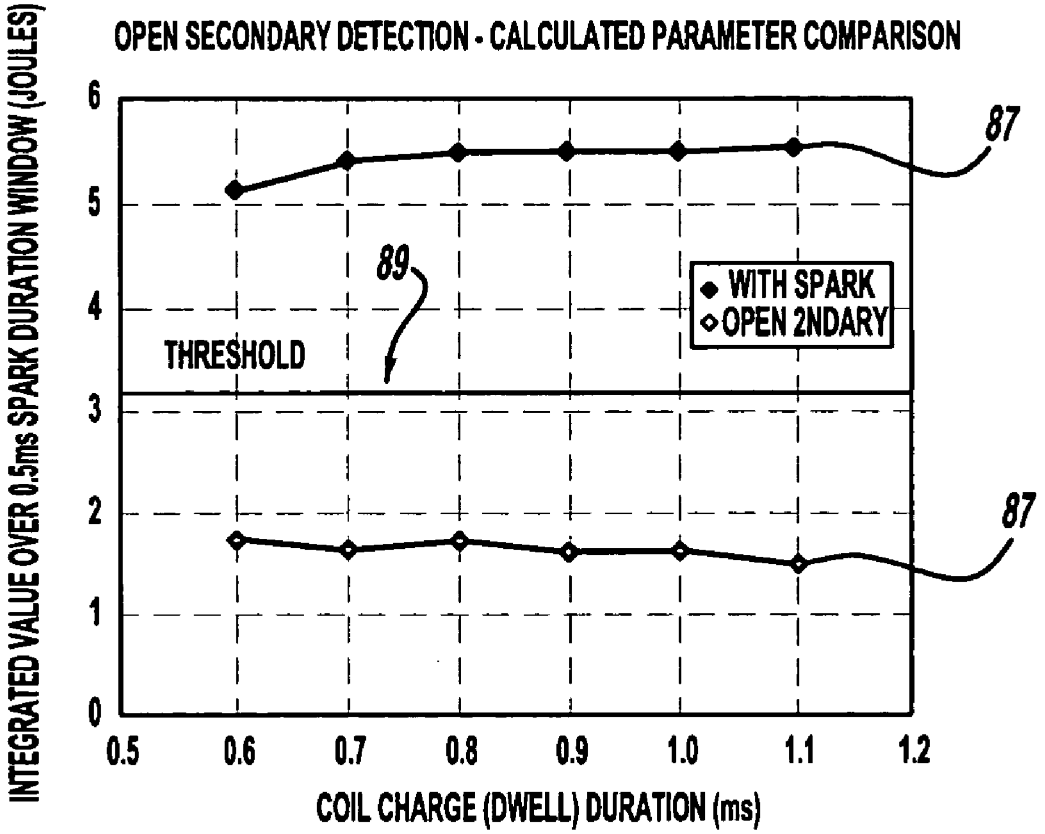
FIG. 5 illustrates a comparison of the normalized integrated values of normal and open secondary conditions with different charge durations.

FIG. 5 illustrates a comparison of the normalized integrated values 87 of normal and open secondary conditions with different charge durations. There exists a large gap in the integrated values 87 between the case of normal operation and the case of an open secondary. Thus, if the threshold is applied in the middle, see FIG. 5, an open secondary can be easily detected even if the dwell durations vary significantly, thus providing another advantage of the present invention. In FIG. 5, dwell times vary from 0.6 to 1.1 msec.

The open secondary detection apparatus 50 of the present invention uses an integrator 90 to integrate the ionization signal 100, and then use a comparator 92 to determine if the integrated ionization signal over the spark window 85 is above a certain threshold 89. If so, then a spark has occurred. Otherwise, a spark has failed to occur which indicates that the secondary 18 is open.

Figure 6:
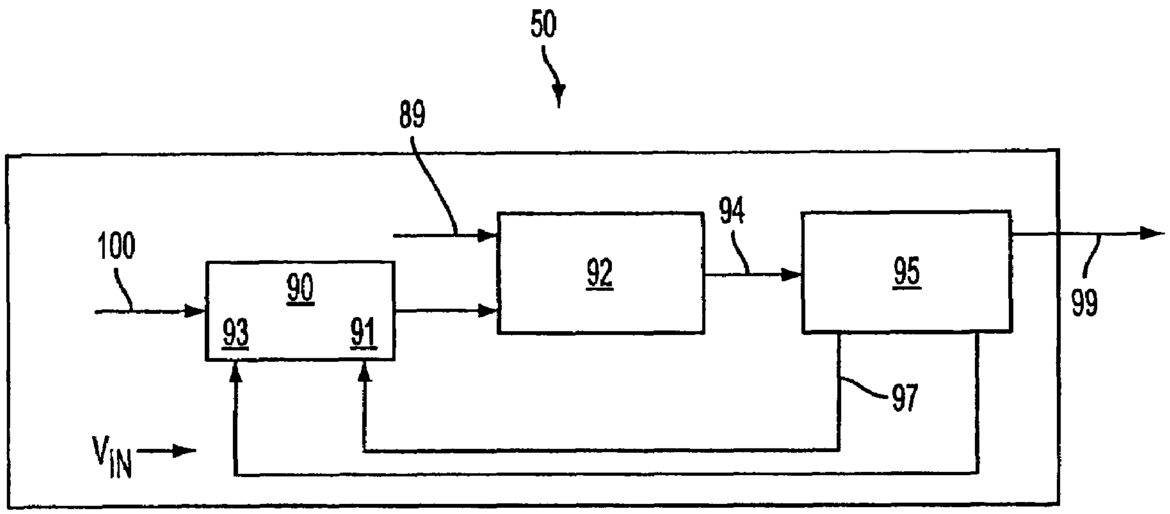
FIG. 6 a logic block diagram of the open secondary detection apparatus which integrates spark energy.
Figure 7:
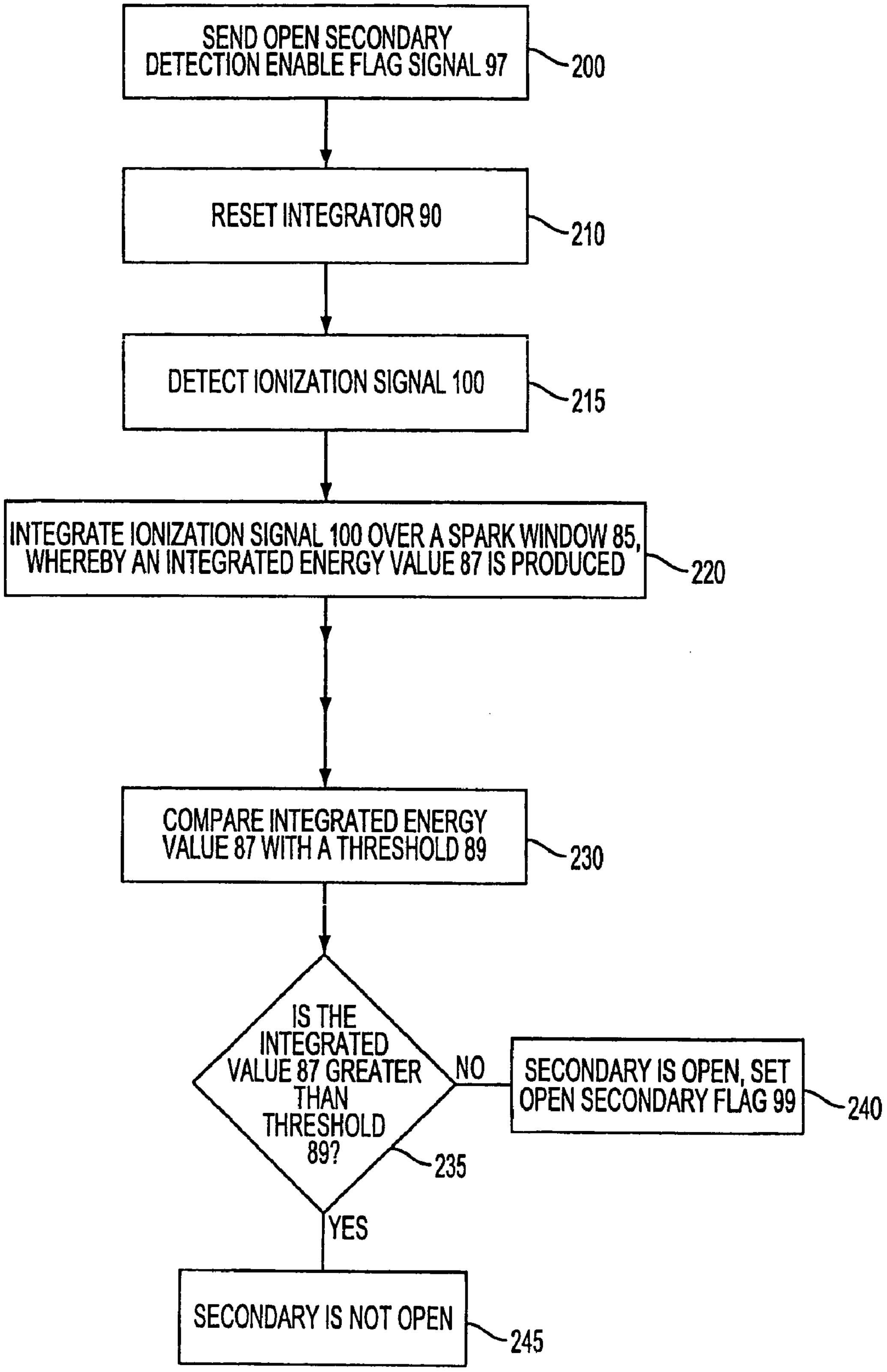
FIG. 7 is a flowchart of the steps taken in determining whether there is an open secondary winding by integrating spark energy.

FIG. 6 is a logic block diagram of the open secondary detection apparatus 50. An overall flowchart showing the logic used in determining whether there is an open secondary winding is shown in FIG. 7. The open secondary detection apparatus is enabled by the powertrain control module 95 which sends an open secondary detection enable flag signal 97 to the enable input 91 of the integrator 90 (200). When the apparatus 50 is enabled, the integrator 90 is reset (210). In a preferred embodiment, a reset pulse sent to the integrator's 90 reset input 93 resets the integrator 90 before the integration step (see below). Often, the rising edge of the ignition charge pulse $V_{IN}$ (from the powertrain control module 95) can also be used for the reset step. Next, the measured ionization signal 100 is detected (215) and integrated over the spark window 85 (220). Then, the integrated value 87 is compared with a given threshold 89 (or reference) (230) in the comparator 92. The powertrain control module 95 queries "is the integrated value 87 greater than the threshold 89 (235)?" If the answer is no, then the integrated value 87 is below the threshold 89 and the output 94 of comparator 92 is set to logic "zero" and the powertrain control module 95 sets the open secondary flag 99 (240). If the answer is yes, then the secondary 18 is not open (245).

Figure 8:
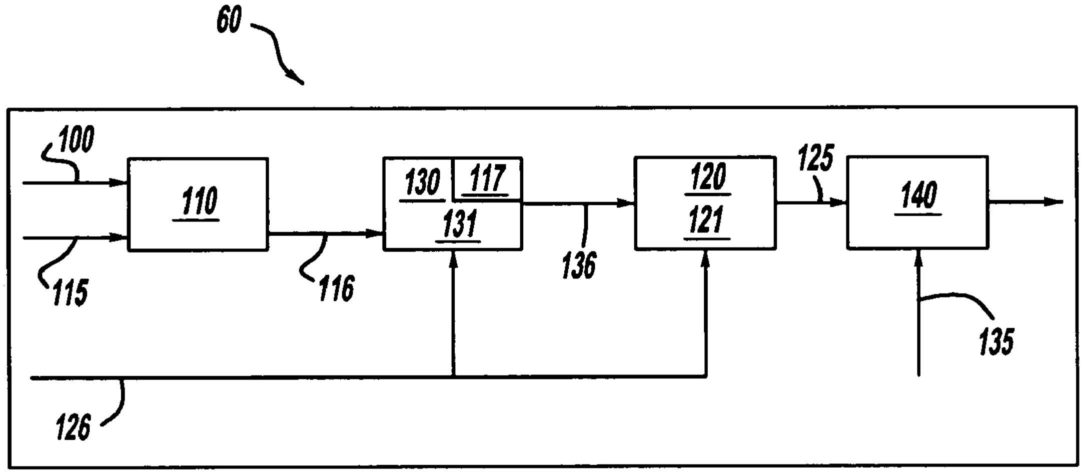
FIG. 8 a logic block diagram of the open secondary detection apparatus which measures spark duration.

The open secondary detection apparatus 60 shown in FIG. 8 of the present invention measures spark duration. Open secondary detection apparatus 60 uses a first comparator 110 that compares the ionization signal 100 with a first threshold 115 over the spark window 85. As long as the magnitude of the ionization signal 100 is above threshold 115, a control signal 136 enables timer 120. Timer 120 measures the time when the ionization signal 100 is above threshold 115 and outputs an ignition duration signal 125, which is a measure of the ignition duration. Next, ignition duration signal 125 is input into a second comparator 140. Comparator 140 determines if the ignition duration 125 is above a duration second threshold 135. If it is, then a spark has occurred. Otherwise, a spark has failed to occur which indicates that the secondary 18 is open.

Figure 9:
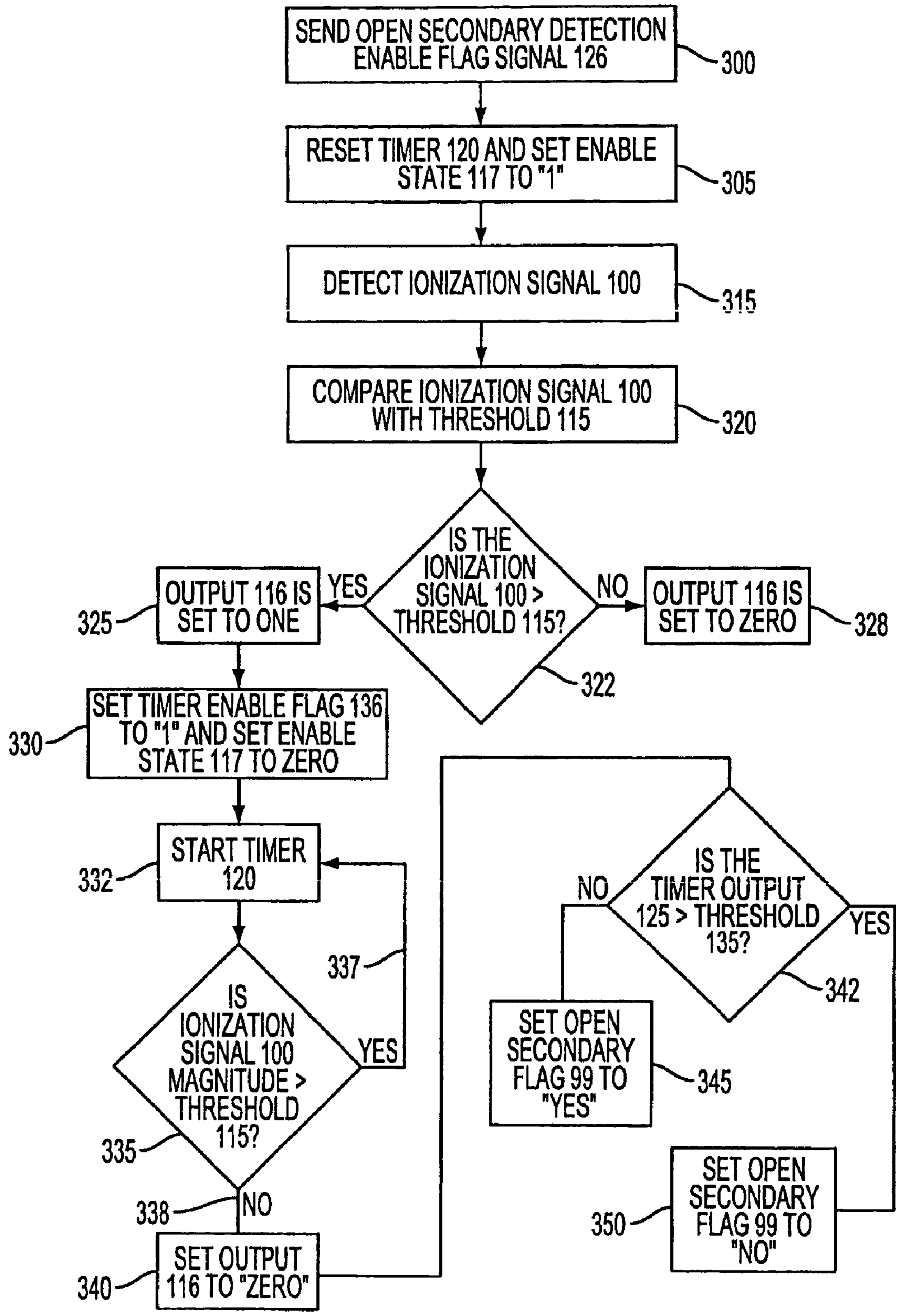
FIG. 9 is a flowchart of the steps taken in determining whether there is an open secondary winding by measuring spark duration.

FIG. 8 is a logic block diagram of the open secondary detection apparatus 60. An overall flowchart showing the logic steps taken in determining whether there is an open secondary winding is shown in FIG. 9. The open secondary detection apparatus 60 is enabled by the powertrain control module 95 which sends an open secondary detection enable flag signal 126 to the enable inputs 131, 121 of both timer controller 130 and timer 120 (300). When the apparatus 60 is enabled, timer 120 is reset and the enable state 117 for timer controller 130 is set to 1 (305). In a preferred embodiment, the rising edge of the enable signal can be used for the reset. Next, the measured ionization signal 100 is detected (315) and compared with threshold 115 over the spark window 85 (320) in first comparator 110. Threshold 115 is set to 60 to 90 percent of the maximum ionization voltage which is proportional to the ionization current. In the case where the maximum ionization voltage is 5 volts, the threshold 115 can be set between 3 to 4.5 volts. The comparator queries "Is the ionization signal 100 greater than threshold 115?" (322) If the ionization signal 100 is greater than threshold 115, then the first comparator's 110 output 116 is set to logic "one" (325). Otherwise output 116 is set to logic "zero" (328).

Output 116 is input to timer controller 130. If output 116 is set to logic "one", which occurs when the magnitude of the ionization signal 100 is above threshold 115, the timer controller 130 sets its timer enable flag output 136 to logic "one" and sets enable state 117 to zero (330). Timer enable flag output 136 is input to timer 120. Setting timer enable flag to logic "one" starts timer 120 (332). Next, the system 60 queries "Is the ionization signal 100 greater than threshold 115?" (335) The timer 120 continues to count the pulse duration as long as the magnitude of the ionization signal 100 is greater than threshold 115 (337). When the magnitude of the ionization signal 100 falls below the threshold 115 (338), the first comparator's 110 output 116 is set to logic "zero" (340) which disables the timer 120. The timer's 120 output 125 is compared with a second threshold 135 or the time duration threshold 135 in comparator 140. The system 60 queries "is the timer output 125 greater than the threshold 135?" (342). Threshold 135 is set to 60 to 90 percent of the minimum spark duration of the given ignition system. For an ignition system with minimal spark duration equal to 0.3 millisecond, threshold 135 can be selected between 0.18 to 0.27 millisecond. If the answer is no, then the timer output 125 is below the'threshold 140 and the secondary 18 is open. The powertrain control module 95 sets the open secondary flag 99 to "Yes" (345). If the answer is yes, then the secondary 18 is not open and the powertrain control module 95 sets the open secondary flag 99 to "No" (350).

While the invention has been disclosed in this patent application by reference to the details of preferred embodiments of the invention, it is to be understood that the disclosure is intended in an illustrative rather than in a limiting sense, as it is contemplated that modification will readily occur to those skilled in the art, within the spirit of the invention and the scope of the appended claims and their equivalents.

What is claimed is:

1. An apparatus for detecting an open secondary winding based on an ionization signal, comprising:

a first comparator having a first and a second input and an output, wherein said first input is operably connected to the ionization signal and said second input is operably connected to a first threshold;

a controller having a first and an enable input and an output, wherein said first input is operably connected to said output of said first comparator;

a timer having a first and an enable input, and an output, wherein said first input is operably connected to said output of said controller; and a second comparator having a first and a second input and an output, wherein said first input is operably connected to said output of said timer and said second input is operably connected to a second threshold.

2. The open secondary winding detection apparatus according to claim 1 further comprising a powertrain control module having an output operably connected to said enable input of said controller.

3. An apparatus for detecting an open secondary winding based on an ionization signal, comprising:

an integrator having the ionization signal input, an enable input, a reset input and an output, said reset input being capable of resetting said integrator, a comparator having a first input operably connected to said output of said integrator, a second input operably connected to a threshold value, and an output, and a powertrain control module having an input operably connected to said output of said comparator and an output operably connected to said enable input of said integrator, wherein said reset input of said integrator is operably connected to an ignition charge pulse.

4. The open secondary winding detection apparatus according to claim 3 further comprising an open secondary detection enable flag signal operably connected to said enable input of said integrator.

5. The open secondary winding detection apparatus according to claim 3 wherein said ionization signal input of said integrator is operably connected to an ionization current measunng circuit.

6. The open secondary winding detection apparatus according to claim 3, wherein an open secondary detection enable flag signal is sent by said powertrain control module to said enable input of said integrator and wherein said ionization current input of said integrator is operably connected to an ionization current measuring circuit.

* * * * *

UNITED STATES PATENT AND TRADEMARK OFFICE

CERTIFICATE OF CORRECTION

PATENT NO. : 7,251,571 B2

APPLICATION NO. : 10/655985

DATED : July 31, 2007

INVENTOR(S) : Guoming G. Zhu et al.

It is certified that error appears in the above-identified patent and that said Letters Patent is hereby corrected as shown below:

Column 7, line 50, before “threshold” delete “ ' ”.

Column 8, line 48, Claim 5, “measunng” should be --measuring--.

Signed and Sealed this

Eighteenth Day of September, 2007

JON W. DUDAS

*Director of the United States Patent and Trademark Office*